United States Patent

Igarashi

[15] 3,644,800

[45] Feb. 22, 1972

[54] SEMICONDUCTOR-CONTROLLED RECTIFYING DEVICE

[72] Inventor: Yukio Igarashi, Yokohama, Japan

[73] Assignee: Tokyo Shibaura Electric Co., Ltd., Kawasaki-shi, Japan

[22] Filed: July 30, 1970

[21] Appl. No.: 59,567

[30] Foreign Application Priority Data

Aug. 4, 1969 Japan....................................44/61044

[52] U.S. Cl...............317/235 AB, 317/235 AA, 317/235 AB

[51] Int. Cl...........................................................H01l 11/10

[58] Field of Search........................................ 317/235(41.1)

[56] References Cited

UNITED STATES PATENTS 3,254,267 5/1966 Sack.......................................315/169

3,486,085 12/1969 Slavin....................................317/235

*Primary Examiner*—John W. Huckert

*Assistant Examiner*—E. Wojciechowicz

*Attorney*—Flynn & Frishauf

[57] ABSTRACT

A controlled rectifying device comprising a four-layer wafer, wherein a first layer of N-type, second layer of P-type and fourth layer of P-type respectively include cathode, gate and anode electrodes. To one side of the wafer is attached the cathode electrode, and to the opposite side are the anode and gate electrodes.

2 Claims, 9 Drawing Figures

SEMICONDUCTOR-CONTROLLED RECTIFYING DEVICE

BACKGROUND OF THE INVENTION

The invention relates to a semiconductor device, and more particularly to a controlled rectifying device of NPNP-type.

The conventional semiconductor device includes a wafer in which a first layer of N-type, second layer of P-type and fourth layer of P-type respectively are provided with cathode, gate and anode electrodes, the cathode and gate electrodes being attached to one side of the wafer, and the anode electrode to the opposite side.

The controlled rectifying device of the aforementioned construction may not generally raise any problem. But if a layer metal plate faces the side of the wafer with the cathode electrode attached to the metal to be negatively grounded, then the following problems will occur.

1. Since it is impossible to enlarge the contact area between the metal plate and cathode electrode due to the presence of the gate electrode, the heat generated in the wafer may not be radiated in good efficiency.

2. It is necessary to provide insulators between the gate electrode and metal plate and to make thin the insulator as there is required a thin cathode electrode for low thermal resistance of the electrode, so that operation efficiency will be reduced.

3. To the wafer surface facing the metal plate are connected the cathode and gate electrodes, causing a short circuit between both electrodes.

SUMMARY OF THE INVENTION

It is accordingly the object of this invention to provide a semiconductor-controlled rectifying device comprising a wafer of NPNP-type four-layer structure, wherein gate and anode layers extend to one side of said wafer and a cathode layer is located on the opposite side thereof, gate and anode electrodes are connected to the first-mentioned side and a cathode electrode to the latter side, and a metal plate faces said latter side in a state connected to the cathode electrode.

According to the present invention, only the cathode electrode is attached to the side of the wafer facing the metal plate so that, if required, the cathode electrode may be formed in the same size as said side of the wafer, thereby improving heat radiation through the electrode. Since the gate and anode electrodes are disposed on the same side of the wafer, it is not required to provide insulators, nor there is any possibility of a short circuit occurring between the gate and cathode electrodes.

BRIEF DESCRIPTION OF THE DRAWINGS

FIGS. 2A to 2E are cross-sectional views showing the sequential steps of manufacturing a semiconductor-controlled rectifying device according to an embodiment of this invention, wherein FIG. 2E shows a finished device;

DESCRIPTION OF THE PREFERRED EMBODIMENTS

For easy understanding of this invention, there will now be described by reference to FIG. 1 the ignition circuit of a vehicle to illustrate an application of a semiconductor-controlled rectifying device, wherein a metal plate connected with a cathode electrode is grounded.

Figure 1:
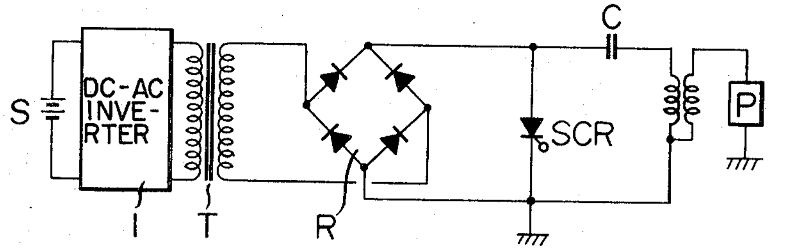
FIG. 1 is an electrical circuit associated with the ignition circuit of a vehicle, illustrating a special application of a semiconductor-controlled rectifying device.

In the secondary winding of a transformer T involved in the circuit shown in FIG. 1 there is generated a voltage of approximately 400 v. by a 12 v. DC source S and a DC-AC inverter I disposed between said source S and transformer T. AC current from the transformer T is inverted into DC current by a bridge rectifier R which charges a capacitance C in a closed circuit including said circuit R.

The resultant charge current of the capacitance C is then directed to the anode of a silicon-controlled rectifying device (SCR). At this time, a predetermined input signal is supplied to the gate of the SCR to ignite it.

As a result, there flows a large current through a first induction coil L, and in consequence a still larger current through a second induction coil $L_2$ magnetically connected to said first coil $L_1$ to ignite an ignition plug P (which is substantially impressed with a voltage of approximately 20 kv.).

In the above-mentioned ignition circuit, the cathode of said SCR is usually grounded by connecting the cathode electrode with the chassis of an automobile through a metal plate. This is for the following reason that the anode side of the device is subject to corrosion, so that where grounding is carried out with the cathode of the device connected to the positive side and the anode connected to the chassis of a vehicle, then said chassis will all be likely to be corroded.

The above-mentioned semiconductor-controlled rectifying device may be used in wide range of application, e.g., in the lighting circuit or regulator circuit of a vehicle.

There will now be described by reference to FIGS. 2A to 2E, a semiconductor-controlled rectifying device, and a manufacturing method thereof.

There is provided a silicon wafer 10 of N-type having a resistivity of 15 to 25 ohm-cm. and a thickness of 170 microns. In the wafer 10 is formed a net-pattern region 11 of P-type by selectively diffusing boron in said wafer from both sides thereof (shown in FIG. 2A). This formation may be attained by conducting diffusion for 140 hrs. at a temperature of 1,250° C.

There are formed in the wafer P-type regions 12 and 13 by diffusing boron therein 25 hours at a temperature of 1,250° C.

Figure 2A:
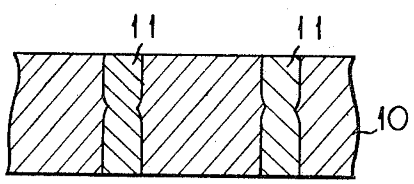
Figure 2D:
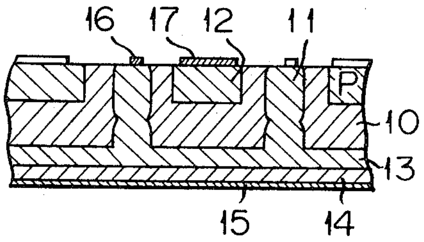
Figure 2B:
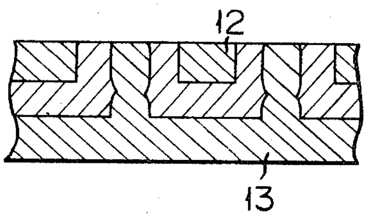
Figure 2E:
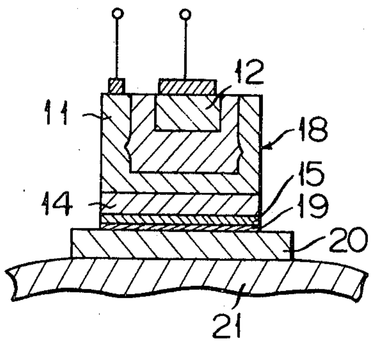

In this case, diffusion from the upper surface of the wafer is conducted using a suitable mask so as to form P-type island regions 12 in an N-type layer, while diffusion from the underside of the wafer is performed so as to provide a P-type layer extending all over said underside. (FIG. 2B)

Figure 2C:
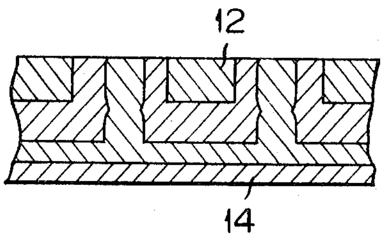

There is formed an N-type layer 14 in said P-type layer 13 by diffusing phosphorus from the lower side of the wafer 10 1 to 3 hours at a temperature of 1,250° C. so as to cover all its underside. (FIG. 2C)

There are formed by the usual techniques employing tungsten and aluminum a cathode electrode 15 on the N-type layer 14, a gate electrode 16 on the P-type net-pattern region 11 and an anode electrode in the P-type island region 12. (FIG. 2D) The wafer 10 is diced along the dividing lines of the net-pattern region 11 to obtain a semiconductor element 18.

The underside of the element 18 or cathode electrode 15 is soldered to a metal plate 20 having a good radiation efficiency through an alloy plate 19 of tungsten and molybdenum. There are bonded lead wires to the gate electrode 16 and anode electrode 17 attached to the upper side of the element 18, to finish a semiconductor device. The device is preferably used with the metal plate 20 connected to the grounded chassis 21 of the vehicle.

In the above-mentioned semiconductor-controlled rectifying device, the cathode electrode is mounted all over the underside of the semiconductor wafer and fitted to the metal plate, enabling the semiconductor device to radiate heat effectively through said cathode electrode. Due to the gate electrode being located on the upper side of the wafer, it is not necessary to provide an insulator between the gate electrode and metal plate nor is any possibility of a short circuit occurring between the gate and cathode electrodes, thereby obtaining good operation efficiency.

Figure 3:
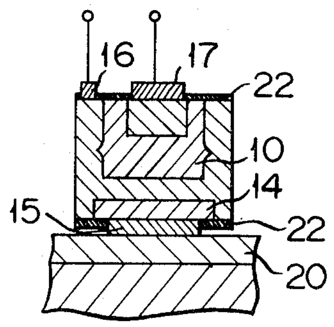
FIG. 3 is a cross-sectional view of a semiconductor-controlled rectifying device according to another embodiment of this invention.
Figure 4:
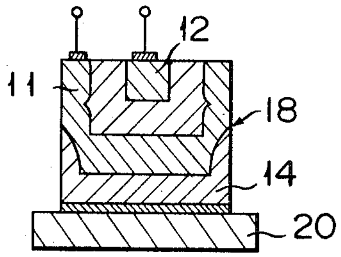
FIG. 4 is a cross-sectional view of a semiconductor-controlled rectifying device according to still another embodiment of this invention.
Figure 5:
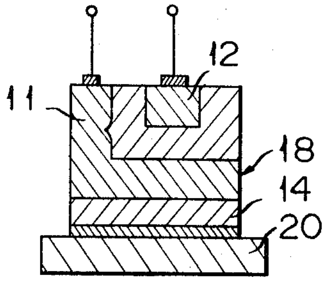
FIG. 5 is a cross-sectional view of a semiconductor-controlled rectifying device according to still another embodiment of this invention.

There will now be detailed other embodiments of the present invention with reference to FIGS. 3 to 5. In these embodiments the same references denote the same parts. However, there will be only described the major parts.

As seen from FIG. 3, the present device is a planar type in which the exposed portions of the PN-junctions are coated with an insulating film, such as silicon dioxide film. The insulating film 22 covers the upper side of the wafer 10 except those parts of said wafer at which there are formed the gate electrode 16 and anode electrode 17, and also the lower side of the wafer excluding that portion thereof on which there is mounted the cathode electrode 15. In this case the cathode layer 14 is not formed all over the lower side of the wafer, and to the peripheral portion of the lower side is extended the P-type gate layer 13.

With the device of the first embodiment, there did appear the possibility that when the semiconductor element 18 was soldered with the metal plate 20, the excess solder would swell out to attach itself to the cathode-gate juncture with the resultant occurrence of a short circuit therebetween. However, the embodiment of FIG. 3 has the advantage that it is entirely free from any such occurrence.

A device shown in FIG. 4 is also of such a structure as is adapted to avoid short-circuiting between the gate and cathode layers. The cathode layer 14 of the device has an upwardly extending peripheral portion, thereby allowing a large space between the metal plate 20 and cathode-gate junction.

As shown in FIG. 5, that part of the gate layer 11 which rises above the element 18 is not necessarily required to surround the N-type region 10 and anode region 12, but to extend upward only on one side of the device.

It should be understood that the present invention can be also applied to various types of semiconductor-controlled rectifying devices such as a center gate type or FI-cut type.

What is claimed is:

1. A semiconductor-controlled rectifying device comprising:

a semiconductor body having an upper surface and a lower surface, said body being formed of stacked regions of a first layer of P-type conductivity forming an anode region, a second layer of N-type conductivity forming a first PN-junction with said anode region, both ends of said PN-junction terminating at said upper surface of said semiconductor body, a third layer of P-type conductivity forming a gate region and forming a second PN-junction with said second layer, both ends of said second PN-junction terminating at said upper surface of said semiconductor body and a fourth layer of N-type conductivity forming a cathode region and forming a third PN-junction with said gate region, both ends of said third PN-junction terminating at a sidewall of said semiconductor body;

an anode electrode mounted on said upper surface of said anode region on said upper surface of said semiconductor body;

a gate electrode mounted on said gate region on said upper surface of said semiconductor body and in substantially the same plane as said anode electrode;

a metal plate cathode electrode thermally and electrically connected to the entire lower surface of said cathode region to form a heat sink, and to provide electrical connection to said cathode region.

2. A semiconductor-controlled rectifying device according to claim 1 wherein a central portion of said third PN-junction is parallel to the metal plate cathode electrode and both end portions of said third PN-junction extend from said central portion toward said upper surface of said semiconductor body, said end portions terminating at a sidewall of said semiconductor body.

* * * * *